United States Patent [19]
Lin et al.

[11] Patent Number: 5,570,391
[45] Date of Patent: Oct. 29, 1996

[54] TRELLIS CODING METHOD USING A MULTILEVEL DELAY DEVICE

[75] Inventors: Mao-Chao Lin, Yung-Ho; Jia-Yin Wang, Taipei, both of Taiwan

[73] Assignee: Chung-Chin Chen, Alexandra, Va.

[21] Appl. No.: 398,797

[22] Filed: Mar. 6, 1995

[51] Int. Cl.⁶ .......................... H04L 27/36; H03M 13/12
[52] U.S. Cl. .......................... 375/265; 375/298; 371/43
[58] Field of Search .......................... 375/265, 298; 371/43

[56] References Cited

U.S. PATENT DOCUMENTS

| | | | |
|---|---|---|---|
| 5,023,889 | 6/1991 | Divsalar et al. | 375/265 |
| 5,052,000 | 9/1991 | Wang et al. | 375/265 |
| 5,164,963 | 11/1992 | Lawrence et al. | 375/265 |
| 5,243,627 | 9/1993 | Betts et al. | 375/265 |

Primary Examiner—Stephen Chin
Assistant Examiner—Jeffrey W. Gluck
Attorney, Agent, or Firm—Bacon & Thomas

[57] ABSTRACT

This invention is a multilevel trellis coding method which employs a single binary convolutional code and is called a single-stage and multilevel trellis coding. This invention can be generalized by combining several single-stage multilevel codings together to form a multilevel trellis coding for which the number of stages is less than the number of coding levels. New trellis coded modulation systems and binary trellis coding systems which are designed by the aforementioned trellis coding method are better than the currently known coding systems if the communication channels are additive white Gaussian noise (AWGN) channels.

11 Claims, 7 Drawing Sheets

Table 1

| Code 1a | $\nu = 2$ | $G = \begin{pmatrix} 1 & 1 & 1 \\ 5 & 7 & 0 \end{pmatrix}$ | $D^2_{free} = 6.34$ |
|---|---|---|---|
| Code 1b | $\nu = 3$ | $G = \begin{pmatrix} 1 & 3 & 2 \\ 7 & 4 & 1 \end{pmatrix}$ | $D^2_{free} = 7.52$ |
| Code 1c | $\nu = 4$ | $G = \begin{pmatrix} 4 & 7 & 3 \\ 5 & 3 & 4 \end{pmatrix}$ | $D^2_{free} = 8.93$ |

Fig. 8

Table 2

| Code 2a | $\nu = 1$ | $G = (1\ 3)$ | $d_{free} = 5$ |
|---|---|---|---|
| Code 2b | $\nu = 2$ | $G = (5\ 7)$ | $d_{free} = 8$ |
| Code 2c | $\nu = 3$ | $G = (17\ 15)$ | $d_{free} = 10$ |
| Code 2d | $\nu = 4$ | $G = (37\ 23)$ | $d_{free} = 10$ |

Fig. 9

TRELLIS CODING METHOD USING A MULTILEVEL DELAY DEVICE

BACKGROUND OF THE INVENTION

This invention is a multistage and multilevel trellis coding method for which the number of coding stages is less than the number of coding levels. The multistage and multilevel coding is designed by combining one or more than one single-stage multilevel trellis coding, where a single-stage multilevel trellis coding is a multilevel coding designed by using a single binary convolutional code. Trellis coded modulation systems and binary trellis coding systems which are designed by the aforementioned trellis coding method are better than the currently known coding systems if the communication channels are additive white Gaussian noise (AWGN) channels.

In a digital communication system, the transmission of information will be corrupted by channel noise or some channel defect, and hence transmission errors are likely to occur. Channel coding is a method to lower the probability of the occurrence of transmission errors. In a channel coding system, the digitized information will be mapped into corresponding codewords. The set of all codewords is called a code. The distance property among codewords can be used to correct transmission errors. Therefore, the transmission reliability can be increased. The mapping between the set of information and the set of codewords is called "coding" or "encoding". If the symbols in each codeword are binary symbols, the channel coding is a binary coding. Sometimes, the mapping is also referred as "code". One kind of channel coding method is called multilevel coding.

A signal space such as the signal constellation which includes 8PSK, 16QAM, 2×8PSK, 2×16QAM, etc., and the collection of binary n-tuples which includes $\{0,1\}^2, \ldots, \{0,1\}^n = \{(a_1, a_2, \ldots, a_n) : a_i \in \{0,1\}\}$, etc., can be partitioned into a multilevel structure. In the first level of partition, the signal space is partitioned into two subsets. These two subsets are partitioned into four subsets in the second level and are further partitioned into more subsets in other levels. In each level of the partition, every subset of the partition structure is partitioned into two subsets which are labeled by 0 and 1 respectively. The difference of labeling bits in each level represents a specific level distance. The multilevel coding is a coding method designed by applying proper binary codes to these labeling bits. Traditionally, a multilevel coding is designed by applying a binary code to each level of the partition structure of the signal space. In this way, an m-level partition structure requires m binary codes for coding. Such a coding can be called an m-stage and m-level coding.

In general, there are two major classes of binary codes (or binary coding); one is the binary block code and the other is the binary trellis code. For a binary block code, at each time unit, k information bits are used as the input to the encoder and n code bits are generated by the encoder as the output. The rate of this binary block code is R=k/n. It should be noted that for a binary block code, the output is solely dependent on the input of the same time unit. In contrast, for a rate R=k/n, binary trellis code, at each time unit, the n code bits generated by the encoder depend not only on the k information bits currently used as input to the encoder but also depend on information bits which were used as input to the encoder at some earlier time units. A binary trellis code is hence a coding with memory. The codewords of a binary trellis code can be represented by paths in a trellis. If we consider soft decoding, most coding theorists will favor binary trellis codes rather than binary block codes.

The performance of a binary trellis code can be evaluated by three major parameters, coding rate R, decoding complexity and probability of decoding errors. A good binary trellis code requires high coding rate, low decoding complexity and low probability of decoding errors. Usually, a low decoding complexity is implied by a small number of states in the code trellis, and a low probability of decoding errors is implied by a large free distance denoted by $d_{free}$. The most important class of binary trellis codes is the binary convolutional code. A binary convolutional code is a linear time-invariant binary trellis code. Binary convolutional codes were introduced several decades ago and are now very popular.

In the 1982 paper entitled "Channel coding with multilevel/phase signals," published in *IEEE Trans. Inform. Theory.*, vol. 28, no. 1, pp. 55–67, G. Ungerboeck proposed a new type of channel coding, called coded modulation, in which the coding and modulation are integrated. Like binary codes, coded modulation can be divided into two major classes, block coded modulation (BCM) and trellis coded modulation (TCM). At present, in practical applications, TCM seems to be the favorite between BCM and TCM.

TCM designs can also be roughly divided into two classes. One is multilevel coding, one of which is the method proposed by K. Yamaguchi and H. Imai and described in the paper entitled "Highly reliable multilevel channel coding system using binary convolutional codes," published in *Electronics Letters*, vol. 23, no. 13, pp. 939–941, 1987, in which each level of the partition structure of the signal space is encoded by a binary convolutional code. The other class, exemplified by the aforementioned method proposed by G. Ungerboeck is not multilevel coding.

Binary trellis coding and trellis coded modulation (TCM) can be combined as a class called trellis coding. The performance of a trellis coding depends on the following three parameters: coding rate, decoding complexity and probability of decoding errors. For decades, there has been no major breakthrough in designing binary trellis codes except for the decoding hardware. Still, binary convolutional codes are widely used. Also, although many interesting TCM methods have been proposed since 1982, the performance of the known TCM methods can not significantly surpass those of the Ungerboeck design.

In the design of TCM, partition of the signal space is usually needed. For example, we now consider the 8PSK signal constellation $\Omega$ as shown in FIG. 1, in which each signal point, $\omega$ can be represented by $\omega(\tilde{s})$, where $\tilde{s}=(s_1, s_2, s_3)$. This 8PSK signal constellation $\Omega$ can be partitioned into an m-level structure, where m=3 and $s_1, s_2, s_3$ are labeling bits for the first, second and third level respectively. The squared Euclidean distance $D_p^2$ between labeling bits for the p-th level is defined by $$D_p^2 = \begin{cases} \min\{D^2(\omega(\tilde{s}), \omega(\tilde{s}')): \omega(\tilde{s}), \omega(\tilde{s}') \in \Omega, \tilde{s} \neq \tilde{s}'\} & p=1 \\ \min\{D^2(\omega(\tilde{s}), \omega(\tilde{s}')): \omega(\tilde{s}), \omega(\tilde{s}') \in \Omega, \tilde{s} \neq \tilde{s}' \\ \text{and } s_j = s_j' \text{ for } 1 \leq j < p\} & 1 < p \leq m \end{cases}$$

where $D^2(\omega(\tilde{s}), \omega(\tilde{s}'))$ stands for the squared Euclidean distance between $\omega(\tilde{s})$ and $\omega(\tilde{s}'))$. For this 8PSK signal constellation $\Omega$, the level distances for the 3-level partition structure are $D_1^2 = 0.586$, $D_2^2 = 2$ and $D_3^2 = 4$ respectively.

Consider the TCM proposed by Ungerboeck for which the 8PSK signal constellation is used. The coding is shown in FIG. 2, in which a rate $R=r/m$ binary convolutional code is used, where $r=2$ and $m=3$. At the t-th time unit, a 2-bit information vector $\tilde{u}(t)=(u_1(t),u_2(t))$ is used as input, and the output of the binary convolutional code encoder is $\tilde{s}(t)=(s_1(t),s_2(t),s_3(t))$. Through the signal mapper, a signal point $\omega(\tilde{s}(t))$ in $\Omega$ is obtained as output. The coding rate of this TCM is 2 information bits per signal point, where each signal point is a symbol in the two-dimensional signal constellation $\Omega$.

Moreover, consider the TCM proposed by Imai for which the 8PSK signal constellation is used. The coding is shown in FIG. 3, where $r=2$ and $m=3$. A multiplexer converts the input information sequence into three subsequences. The first subsequence is encoded into a binary sequence $\{\ldots,s_1(t-1),s_1(t),\ldots\}$ by a rate $R_1=\frac{1}{4}$ binary convolutional code $C_1$. The second subsequence is encoded into a binary sequence $\{\ldots,s_2(t-1),s_2(t),\ldots\}$ by a rate $R_2=\frac{7}{8}$ binary convolutional code $C_2$. The third subsequence is encoded into a binary sequence $\{\ldots,s_3(t-1),s_3(t),\ldots\}$ by a rate $R_3=\frac{7}{8}$ binary convolutional code $C_3$. By passing the three binary sequences through the signal mapper, we obtain a sequence $\{\ldots,\omega(\tilde{s}(t-1)),\omega(\tilde{s}(t)),\ldots\}$ as the output sequence. The coding rate of this TCM is $(R_1+R_2+R_3)=2$ information bits per signal point.

The TCM designed by Imai is a kind of multilevel coding, and the TCM designed by Ungerboeck is not, although both the Imai method and the Ungerboeck method apply the three-level partition structure of the 8PSK signal constellation. An essential feature of the multilevel coding is in the encoding process, in which we sequentially encode the first level, the second level, and then the third level of the partition structure, respectively. As a result, we can sequentially decode the first level, the second level and the third level, respectively, during the decoding process. For the Ungerboeck method, the encodings for all the three levels are completed simultaneously, and the decodings for all three levels are completed simultaneously.

Today, we are facing a world which badly needs to integrate separated places and individual persons by communication links. The need for reliably and rapidly transmitting large amount of information from one place to another or to many other places is always increasing. Channel coding methods play important roles in fulfilling this need. Hence, it is essential to design a new channel coding method with much improved performance.

SUMMARY OF THE INVENTION

For a traditional multilevel trellis coding, each level of the partition of the signal space must be encoded by an individual binary convolutional code. This is a restriction which results in poor coding performances. Our invention gets rid of the traditional restriction that each level must be encoded by an individual binary convolutional code. Instead, in our invention, we use a single binary convolutional code to encode all levels in the partition structure. More generally, we may use several binary convolutional codes to encode all levels in the partition structure, where the number of binary convolutional codes is less than the number of levels in the partition structure. Using this new idea, we can construct a new TCM. Compared to the currently known coded modulation, under the same coding rates and similar decoding complexities, the probability of decoding errors of the new TCM is much lower. We can also construct binary trellis codes, having improved performance over the binary convolutional codes that are currently widely used. Hence, the proposed multilevel coding method has high potential in practical applications.

BRIEF DESCRIPTION OF THE DRAWINGS

FIG. 8 includes a Table 1 which shows the generator matrices of some binary convolutional codes together with their free distances for the first embodiment of the present invention;

FIG. 9 includes a Table 2 which shows the generator matrices of some binary convolutional codes together with their free distances for the third embodiment of the present invention;

DESCRIPTION OF THE PREFERRED EMBODIMENTS

Figure 1:
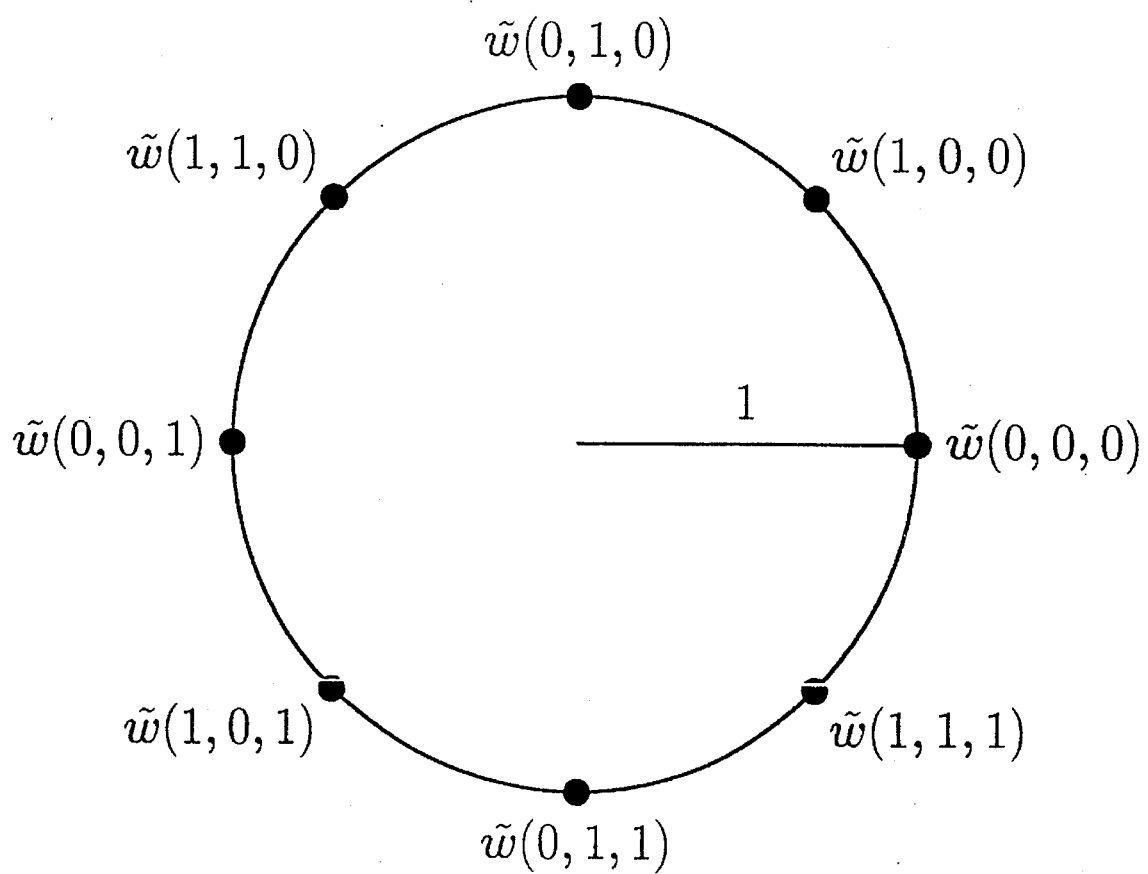
FIG. 1 is a view of the signal constellation of 8PSK.
Figure 2:
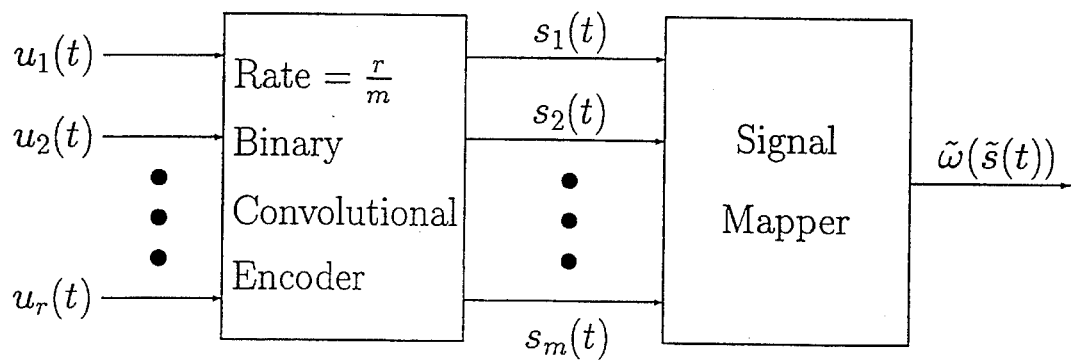
FIG. 2 is an illustration of Ungerboeck's coding method.
Figure 3:
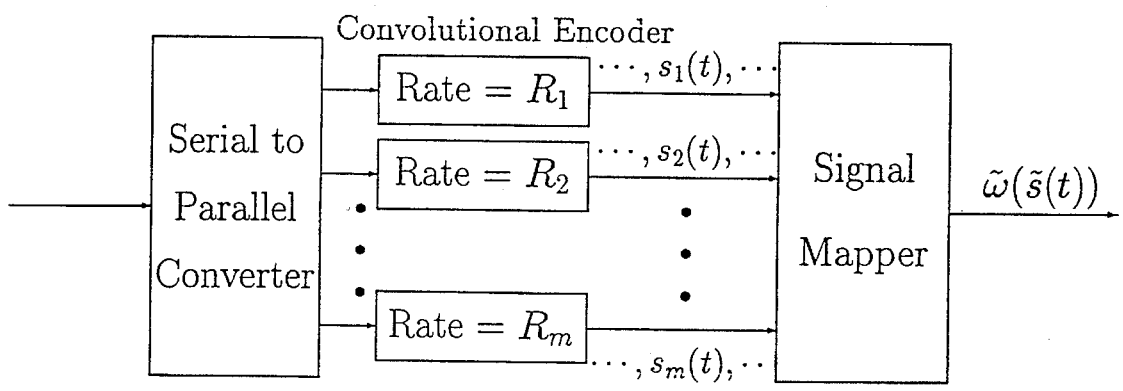
FIG. 3 is an illustration of Imai's coding method.

For this invention, at first we partition the signal space $\Omega$, which consists of $2^m$ signal points and may be either a signal constellation or a collection of binary n-tuples, into an m-level structure. Every signal point $\omega$ in $\Omega$ can be written by $\omega(\tilde{s})$, where $\tilde{s}=(s_1,s_2,\ldots,s_m)$, and $s_1,s_2,\ldots,s_m \in \{0,1\}$. The level distance $\Delta p$ is defined as follows:

$$\Delta_p = \begin{cases} \min\{\Delta(\tilde{\omega}(\tilde{s}),\tilde{\omega}(\tilde{s}')): \tilde{\omega}(\tilde{s}),\tilde{\omega}(\tilde{s}')\in\Omega, \tilde{s}\neq\tilde{s}'\} & p=1 \\ \min\{\Delta(\tilde{\omega}(\tilde{s}),\tilde{\omega}(\tilde{s}')): \tilde{\omega}(\tilde{s}),\tilde{\omega}(\tilde{s}')\in\Omega, \tilde{s}\neq\tilde{s}' \\ \text{and } s_j = s_j' \text{ for } 1 \leq j < p\} & 1 < p \leq m \end{cases},$$

If $\Omega$ is a signal constellation, then $\Delta(\omega(\tilde{s}),\omega(\tilde{s}'))$ stands for the squared Euclidean distance between $\omega(\tilde{s})$ and $\omega(\tilde{s}')$, i.e., $D^2(\omega(\tilde{s}),\omega(\tilde{s}'))$; and if $\Omega$ is a collection of binary n-tuples, then $\Delta(\omega(\tilde{s}),\omega(\tilde{s}'))$ stands for the Hamming distance between $\omega(\tilde{s})$ and $\omega(\tilde{s}')$, i.e., $d(\omega(\tilde{s}),\omega(\tilde{s}'))$. We may say that the distance structure of the signal space is $\{\Delta_1,\Delta_2,\ldots,\Delta_m\}$. For example, the 8PSK signal constellation can be partitioned into a three-level structure, for which the distance structure is $$\Delta_1 = D_1^2 = 0.586, \Delta_2 = D_2^2 = 2, \Delta_3 = D_3^2 = 4.$$

Moreover, for example, we may partition the collection of binary n-tuples $\Omega = \{0,1\}^2$ as $$\begin{aligned}
\Omega &= \{0,1\}^2 = \{(\alpha_1, \alpha_2), \alpha_1, \alpha_2 \in \{0,1\}\} \\
&= \{\bar{\omega}(\tilde{s}_0) = \bar{\omega}(0,0) = (\alpha_1 = 0, \alpha_2 = 0), \bar{\omega}(\tilde{s}_1) = \bar{\omega}(1,0) = (\alpha_1 = 0, \alpha_2 = 1), \\
&\quad \bar{\omega}(\tilde{s}_2) = \bar{\omega}(1,1) = (\alpha_1 = 1, \alpha_2 = 0), \bar{\omega}(\tilde{s}_3) = \bar{\omega}(0,1) = (\alpha_1 = 1, \alpha_2 = 1)\}.
\end{aligned}$$

let $d(\omega(\tilde{s}),\omega(\tilde{s}'))$ stand for the Hamming distance between $\omega(\tilde{s})$ and $\omega(\tilde{s}')$ which are represented by $(a_1,a_2)$ and $(a'_1,a'_2)$. For example, $d(\omega(\tilde{s}_0),\omega(\tilde{s}_2))=d((0,0),(1,0))=1$. We can then have the distance structure for $\Omega$ by $$\begin{aligned}
\Delta_1 &= d_1 = \min\{d(\bar{\omega}(\tilde{s}),\bar{\omega}(\tilde{s}')): \tilde{s}, \tilde{s}' \in \Omega, \tilde{s} \neq \tilde{s}'\} = 1, \\
\Delta_2 &= d_2 = \min\{d(\bar{\omega}(\tilde{s}_1,\tilde{s}_2),\bar{\omega}(\tilde{s}_1',\tilde{s}_2')): \bar{\omega}(\tilde{s}_1,\tilde{s}_2), \bar{\omega}(\tilde{s}_1',\tilde{s}_2') \in \Omega, \text{ and} \\
&\quad \tilde{s}_1 = \tilde{s}_1', \tilde{s}_2 \neq \tilde{s}_2'\} \\
&= \min\{d(\bar{\omega}(\tilde{s}_0),\bar{\omega}(\tilde{s}_3)), d(\bar{\omega}(\tilde{s}_1),\bar{\omega}(\tilde{s}_2))\} = 2.
\end{aligned}$$

Figure 4:
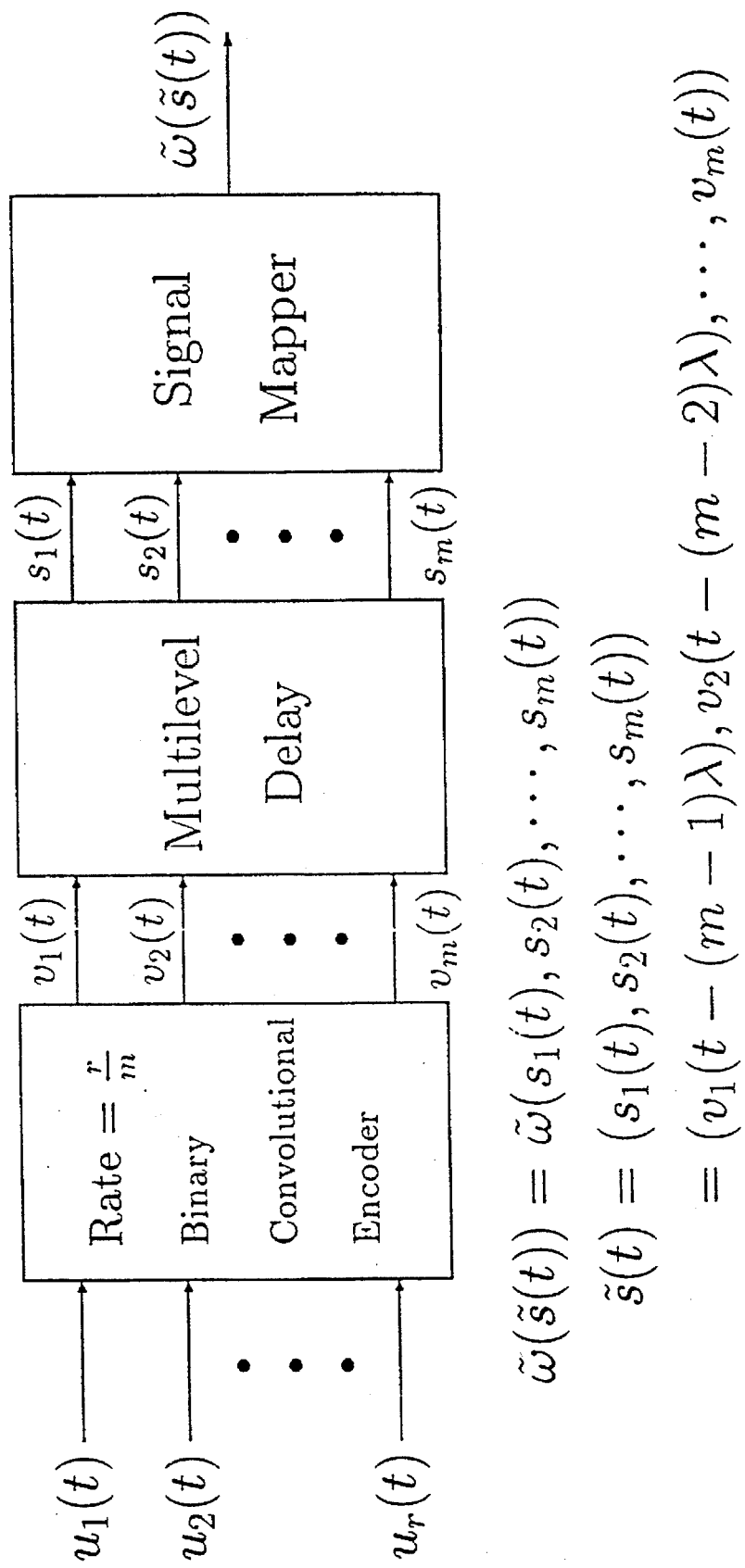
FIG. 4 is an illustration of the m-level and single-stage coding method according to the present invention.

In our invention, with the m-level partition structure for the signal space $\Omega$, we can design a trellis coding, for which the coding rate is R information bits per signal point in $\Omega$. The schematic diagram of coding is shown in FIG. 4, in which a single binary convolutional code C with rate R=r/m is used. At the t-th time unit, the convolutional code converts the r-bit message input $\tilde{u}(t)=(u_1(t),u_2(t), \ldots, u_r(t))$ into the m-bit output $\tilde{v}(t)=(v_1(t),v_2(t), \ldots, v_m(t))$, which is fed into a multilevel delay processor. The output of the multilevel delay processor is $\tilde{s}(t)=(s_1(t),s_2(t), \ldots, s_m(t))$, where $$s_p(t) = v_p(t-(m-p)\lambda), \quad 1 \leq p \leq m,$$

and $\lambda$ is a constant. Using $\tilde{s}(t)$ as the input to the signal mapper, we have a signal point $\omega(\tilde{s}(t))$ in $\Omega$. It should be noted that the multilevel delay processor takes $v_1(t), v_2(t), \ldots, v_m(t)$ as inputs which appear in the m levels of $\Omega$ respectively, and then arranges the m levels in a way that there is a bottom-to-top, multilevel delay, which means that the (p−1)-th level is delayed by $\lambda$ time units as compared to the p-th level. At the beginning of transmission, there are bit positions in the upper levels which are not assigned using the previously stated formula. For these bit positions, we can fill in arbitrary bit values which are recognized by both the transmitting side and the receiving side.

Let $\bar{s} = \{\ldots, \tilde{s}(t-1), \tilde{s}(t), \tilde{s}(t+1), \ldots\}$ and $\bar{s}' = \{\ldots, \tilde{s}'(t-1), \tilde{s}'(t), \tilde{s}'(t+1), \ldots\}$ be two distinct s sequences and the associated v sequences be $\bar{v} = \{\ldots, \tilde{v}(t-1), \tilde{v}(t), \tilde{v}(t+1), \ldots\}$ and $\bar{v}' = \{\ldots, \tilde{v}'(t-1), \tilde{v}'(t), \tilde{v}'(t+1), \ldots\}$ respectively, and let the associated $\omega$ sequences be $\bar{\omega} = \{\ldots, \omega(\tilde{s}(t-1)), \omega(\tilde{s}(t)), \omega(\tilde{s}(t+1)), \ldots\}$ and $\bar{\omega}' = \{\ldots, \omega(\tilde{s}'(t-1)), \omega(\tilde{s}'(t)), \omega(\tilde{s}'(t+1)), \ldots\}$ respectively. Suppose that the Hamming distance between $\bar{v}$ and $\bar{v}'$ is d. Suppose that among the d positions for which $\bar{v}$ and $\bar{v}'$ are distinct, $d_p$ of them are located in the p-th level. We use $d(\bar{v},\bar{v}')=(d_1,d_2,\ldots,d_m)$ to represent this relation. It is clear that $d = \Sigma_{p=1}^m d_p$.

The distance between $\bar{\omega}$ and $\bar{\omega}'$ can be calculated to be $$\Delta(\bar{\omega},\bar{\omega}') = \sum_{p=1}^m \Delta_p d_p.$$

Consider the following example. Let m=3 and $\bar{v}=(\ldots, (000), (000), (000), \ldots)$ and $\bar{v}'=(\ldots, (000), \bar{v}'(t)=(100), \bar{v}'(t+1)=(110), \bar{v}'(t+2)=(111), (000), \ldots)$, We see that $d(\bar{v}, \bar{v}')=(d_1=3, d_2=2, d_3=1)$. Moreover, $d=6=d_1+d_2+d_3$. Through a multilevel delay processor with the constant $\lambda=3$, sequences $\bar{v}$ and $\bar{v}'$ are converted into sequences $\bar{s}$ and $\bar{s}'$, which are respectively given by $$\bar{s} = \begin{bmatrix} \ldots & 0 & 0 & 0 & 0 & 0 & 0 & 0 & 0 & 0 & 0 & 0 & 0 & \ldots \\ \ldots & 0 & 0 & 0 & 0 & 0 & 0 & 0 & 0 & 0 & 0 & 0 & 0 & \ldots \\ \ldots & 0 & 0 & 0 & 0 & 0 & 0 & 0 & 0 & 0 & 0 & 0 & 0 & \ldots \end{bmatrix} \begin{matrix} s_1 \\ s_2 \\ s_3 \end{matrix}$$

(columns indicated: $\tilde{s}(t), \tilde{s}(t+1), \tilde{s}(t+3), \tilde{s}(t+6), \tilde{s}(t+8)$)

and $$\bar{s}' = \begin{bmatrix} \ldots & 0 & 0 & 0 & 0 & 0 & 0 & 0 & 0 & 0 & 0 & 0 & 0 & \ldots \\ \ldots & 0 & 0 & 0 & 0 & 0 & 0 & 0 & 0 & 0 & 0 & 0 & 0 & \ldots \\ \ldots & 0 & 0 & 0 & 0 & 0 & 0 & 0 & 0 & 0 & 0 & 0 & 0 & \ldots \end{bmatrix} \begin{matrix} s_1' \\ s_2' \\ s_3' \end{matrix}$$

(columns indicated: $\tilde{s}'(t), \tilde{s}'(t+1), \tilde{s}'(t+3), \tilde{s}'(t+6), \tilde{s}'(t+8)$)

By feeding sequences $\bar{s}$ and the $\bar{s}'$ into the signal mapper, we can obtain the output sequences $\bar{\omega}$ and $\bar{\omega}'$ respectively. Suppose that the signal space is the 8PSK signal constellation which has a distance structure of $\{\Delta_1 = D_1^2 = 0.586, \Delta_2 = D_2^2 = 2, \Delta_3 = D_3^2 = 4\}$. With this, we have $D^2(\omega(\tilde{s}(t+2)), \omega(\tilde{s}'(t+2))) = 4$, $D^2(\omega(\tilde{s}(t+5)), \omega(\tilde{s}'(t+5))) = 2$, $D^2(\omega(\tilde{s}(t+i)), \omega(\tilde{s}'(t+i))) = 0.586$ for $i = 6, 7, 8$. Thus, we have $D^2(\bar{\omega}, \bar{\omega}') = 0.586 \times 3 + 2 \times 2 + 4 \times 1 = 9.758$. Note that in this example, $\lambda \geq 3$ is large enough to ensure that $\Delta(\omega, \omega')$ be equal to 9.758.

If $\lambda$ is large enough, then the free distance for this trellis coding will be $$\min_{\bar{v}, \bar{v}' \in C, \bar{v} \neq \bar{v}'} \left\{ \sum_{p=1}^m \Delta_p d_p \right\},$$

where $d(\bar{v},\bar{v}')=(d_1,d_2,\ldots,d_m)$. By computer search, we can find proper binary convolutional codes so that the free distance of the new trellis coding will be much larger than the currently known trellis coding.

Decoding for the proposed multilevel trellis coding can be implemented by using the trellis for the binary convolutional code C and the Viterbi algorithm. The truncation length used in the Viterbi algorithm can be set to be the delay constant $\lambda$ of the multilevel delay structure. If the number of memory units for the binary convolutional code is $v$, then the number of states for the trellis structure is $2^v$. Let $\bar{\omega} = \{\ldots, \omega(\tilde{s}(t-1)), \omega(\tilde{s}(t)), \omega(\tilde{s}(t+1)), \ldots\}$ be the transmitted signal sequence and $\bar{z} = \{\ldots, \tilde{z}(t-1), \tilde{z}(t), \tilde{z}(t+1), \ldots\}$ be the sequence received by the decoder. At the $(t+(m-1)\lambda)$-th time unit, the decoder has already received . . . , $\tilde{z}(t+(m-1)\lambda-2),\tilde{z}(t+(m-1)\lambda-1)$ and $\tilde{z}(t+(m-1)\lambda)$. Meanwhile, for $i \geq \lambda, v_1(t-i), v_2(t-i), \ldots, v_{m-1}(t-i)$ has already been decoded. According to the received signal $\tilde{z}(t+(m-p)\lambda)$, we can calculate the bit metric $M_{v_p(t)}, 1 \leq p \leq m$, $v_p(t) \in \{0,1\}$. With bit metrics $M_{v_1(t)=0}, M_{v_1(t)=1}, \ldots, M_{v_m(t)=0}, M_{v_m(t)=1}$, we can calculate $2^m$ possible branch metrics for various $\tilde{v}(t)$. With branch metrics and the trellis of the binary convolutional code C, we can then use Viterbi algorithm to recover $\tilde{v}(t-\lambda+1)$ and $\tilde{u}(t-\lambda+1)$.

The aforementioned coding method is a multilevel coding based on a single binary convolutional code. We call this new coding a single-stage multilevel trellis coding. Basically, this new coding method uses a binary convolutional code to generate m bits, which are then processed by a multilevel delay processor and a signal mapper to select a signal point in the signal space. This method can be easily generalized to a multilevel trellis coding based on several binary convolutional codes. The design is as follows. We use q binary convolutional codes to totally generate m bits, i.e., $v_1(t), v_2(t), \ldots, v_m(t)$, which are converted into $s_1(t), s_2(t), \ldots, s_m(t)$ by a multilevel delay processor, where $q < m$ and $$s_p(t) = v_p(t-(m-p)\lambda), 1 \leq p \leq m,$$

and $\lambda$ is a constant. Then, we have a q-stage and m-level trellis coding, where $q \leq m$. Note that the difference between the q-stage and m-level trellis coding with $q > 1$ and the single-stage and multilevel trellis coding only lies in the number of binary convolutional codes which are used to generate $v_1(t), v_2(t), \ldots, v_m(t)$.

In the following, we will use several embodiments to illustrate this invention.

Figure 5:
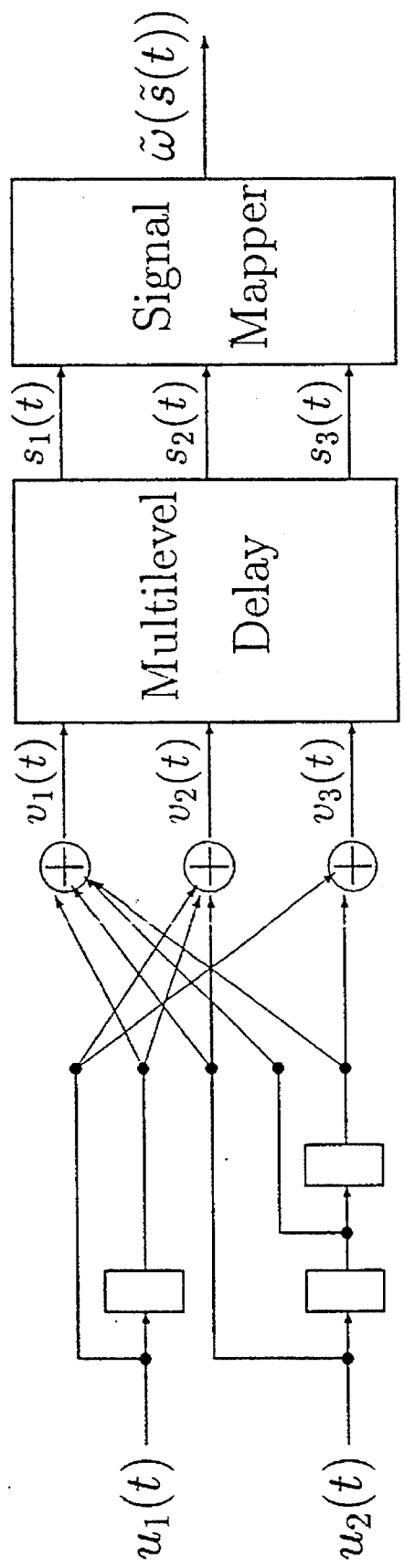
FIG. 5 is the coding configuration of code 1b of table 1 according to the first embodiment of the present invention.
Figure 6:
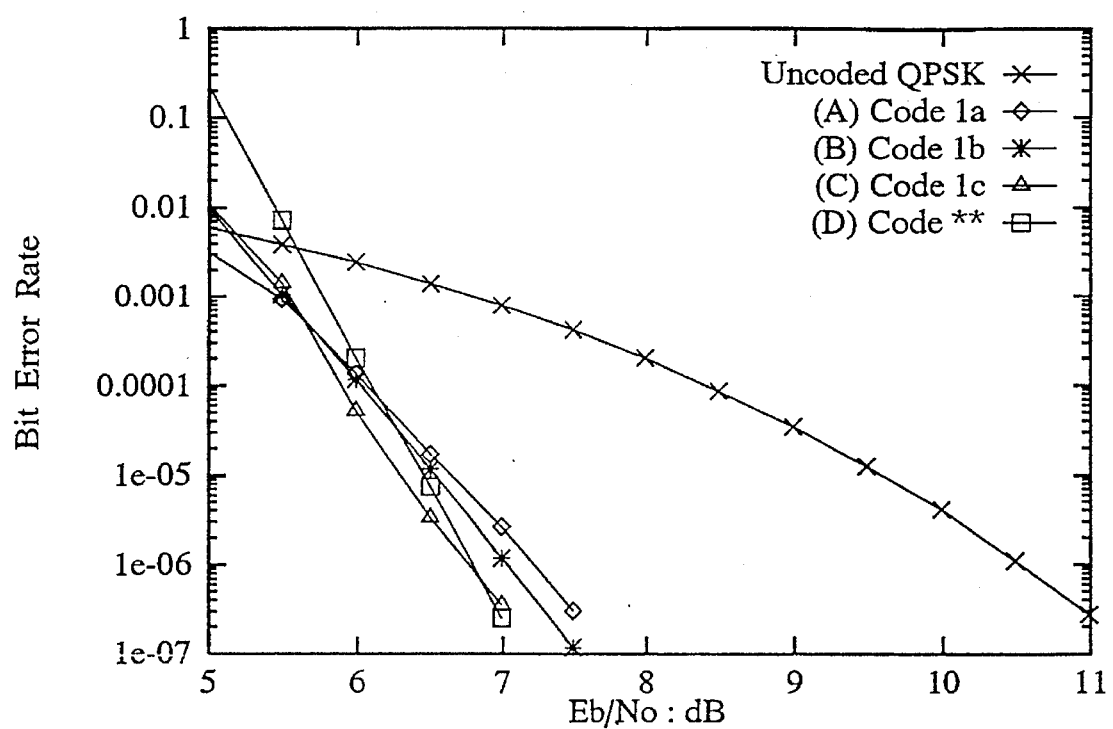
FIG. 6 shows the simulation results of TCM in additive white Gaussian noise channel according to the first and the second embodiments of the present invention.

The first embodiment uses the 8PSK signal constellation as a signal space that is partitioned into a three-level structure with a distance structure of $\{\Delta_1=0.586, \Delta_2=2, \Delta_3=4\}$. We use a rate $R=\frac{2}{3}$ binary convolutional code with $v$ memory units, which implies that the number of trellis states is $2^v$. In this way, we have a TCM with a coding rate of 2 information bits per signal point in the 8PSK signal constellation. In Table 1, for each of $v=2, 3$ and 4, we show a promising candidate for the binary convolutional code which is characterized by its generator matrix. Then, we have code 1a, code 1b and code 1c, which represent the TCM with $v=1, 2$ and 3 respectively. The free distances, $D_{free}^2$ for codes 1a, 1b and 1c are 6.34, 7.52 and 8.93 respectively. A detailed coding configuration for code 1b is given in FIG. 5. The trellis for code 1b has 8 states. Compared to uncoded QPSK, code 1b has an asymptotic coding gain of 5.75 dB in the AWGN channel. If we use the 8-state TCM designed by Ungerboeck in 1982, the asymptotic coding gain is only 3.6 dB. By taking the delay constant $\lambda$ to be $10 \times v$, we can have simulation results as shown in FIG. 6. From FIG. 6, we see that for code 1b, the coding gain over uncoded QPSK is 3.5 dB at a bit error rate of $10^{-6}$.

Consider the second embodiment, which uses the 2×8PSK signal constellation as signal space that is partitioned into a six-level structure with a distance structure of $\{\Delta_1=0.586, \Delta_2=1.172, \Delta_3=2, \Delta_4=4, \Delta_5=4, \Delta_6=8\}$. We use a rate $R=\frac{4}{6}$ binary convolutional code with $v=3$ memory units, for which its generator matrix is given by $$\begin{pmatrix} 2 & 2 & 3 & 2 & 0 & 3 \\ 0 & 3 & 0 & 0 & 2 & 3 \\ 3 & 3 & 3 & 0 & 1 & 1 \\ 1 & 0 & 0 & 1 & 1 & 1 \end{pmatrix}, \quad (**)$$

In this way, we have an 8-state TCM for which the coding rate is 4 information bits per signal point in the 2×8PSK signal constellation, i.e., 2 information bits per signal point in the 8PSK signal constellation. The free distance is $D_{free}^2 = 9.86$, and the asymptotic coding gain is 6.93 dB compared to uncoded QPSK; the simulation results are given in FIG. 6. It is clear that the TCM in the second embodiment is better than the TCM given in the first embodiment.

Figure 7:
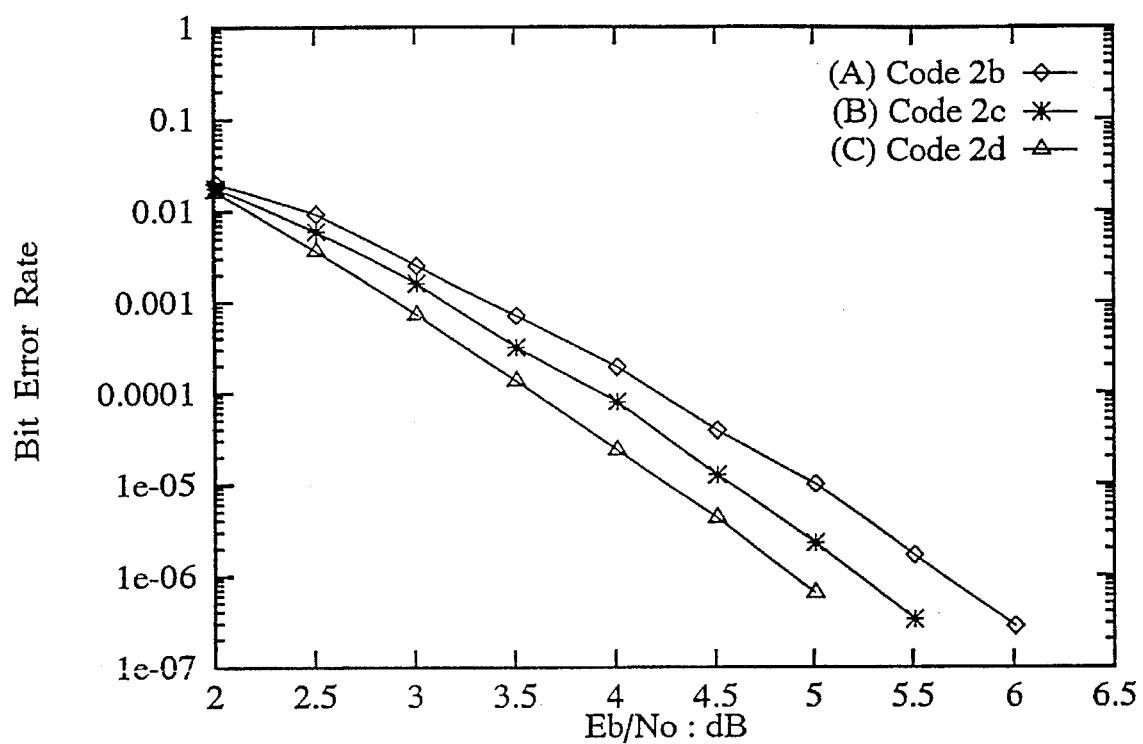
FIG. 7 shows the simulation results of binary trellis codes in additive white Gaussian noise channel according to the third embodiment of the present invention.

Consider the third embodiment, which uses $\{0,1\}^2$ as signal space that is partitioned into a two-level structure with a distance structure of $\{\Delta_1=1, \Delta_2=2\}$. We use a rate $R=\frac{1}{2}$ binary convolutional code with $v$ memory units, which implies that the number of trellis states is $2^v$. In this way, we have a binary trellis code with a coding rate of $\frac{1}{2}$. In Table 2, for each of $v=1, 2, 3$ and 4, we show a promising candidate for the binary convolutional code which is characterized by its generator matrix. Then, we have code 2a, code 2b, code 2c and code 2d, which represent the binary trellis code with $v=1, 2, 3$ and 4 respectively. The free distances, $d_{free}$ for codes 2a, 2b, 2c and 2d are 5, 8, 10 and 10 respectively. In comparison, the best known binary convolutional code with 16 trellis states has a free distance of only 7. By taking the delay constant $\lambda$ to be $10 \times v$, we can have simulation results as shown in FIG. 7, from which we see that a bit error rate of $10^{-6}$ can be obtained at $E_b/N_0=5.2$ dB by using code 2c. Note that the binary trellis codes in Table 2 are designed by using the single-stage and 2-level trellis coding method. In fact, we can easily design more powerful codes by using the single-stage and 4-level trellis coding method instead of using the single-stage and 2-level trellis coding method. The resultant codes will have even more powerful performance capabilities.

One of the characteristics of the proposed multilevel trellis coding is to process the output of one or several binary convolutional codes by a multilevel delay such that the $(p-1)$-th level will be delayed by $\lambda$ time units as compared to the p-th level. However, the delay requirement can be less restricted by requiring the $(p-1)$-th level to be delayed by $\lambda_p$ time units as compared to the p-th level, where $\lambda_2, \lambda_3, \ldots, \lambda_m$ may not necessarily be identical but should be some large enough numbers. Moreover, some but not all $\lambda_p$ can be set to zero. Furthermore, this invention can be designed in such a way that there are more than one output signal points for each time unit. For example, we use one or several binary convolutional codes to generate h·m bits, where m is an integer. These h·m bits are divided into h groups such that each group has m bits. The m bits of each group are independently processed by a multilevel delay processor and then fed into a signal mapper to select a signal point in $\Omega$. Thus, the coding system can generate h signal points in $\Omega$ for each time unit. In addition, we can replace the binary convolutional code used in our design by the more general binary trellis code. If a proper binary trellis code is used, the performance of the coding will also be very good.

What is claimed is:

1. A multilevel trellis coding method, comprising the steps of:

i) using a single binary trellis code of rate $R=r/m$ to encode an r-bit information input $\tilde{u}(t)=(u_1(t), u_2(t), \ldots, u_r(t))$ at the t-th time unit so as to obtain an m-bit output $\tilde{v}(t)=(v_1(t), v_2(t), \ldots, v_m(t))$;

ii) processing said output of the binary trellis code through a multilevel delay processor permitting a processed output $\tilde{s}(t)=(s_1(t), s_2(t), \ldots, s_m(t))$ such that $$s_p(t) = v_p\left(t - \sum_{i=p+1}^{m} \lambda_i\right), 1 \leq p \leq m,$$

wherein $\lambda_2, \lambda_3, \ldots, \lambda_m$ are constants and said multilevel delay arranges the input bit $s_p(t), 1 \leq p \leq m$, at the p-th level of an m-level process, in which the (p−1)-th level is delayed by $\lambda_p$ time units more than the p-th level; and iii) feeding said output of the multilevel delay processor into a signal mapper to select a signal point in a signal space.

2. A multilevel trellis coding method in claim 1, wherein said single binary trellis code is replaced by several binary trellis codes of which the number is less than the value m so that said several binary trellis codes together convert $\tilde{u}(t)=(u_1(t),u_2(t),\ldots,u_r(t))$ into $\tilde{v}(t)=(v_1(t),v_2(t),\ldots,v_m(t))$, which is then processed by a multilevel delay processor and a signal mapper.

3. A multilevel trellis coding method as in claims 1 or 2, wherein the $s_p$ which are not assigned values due to said multilevel delay process are assigned values which are recognized by both the encoder and the decoder of a coding system using said coding method.

4. A multilevel trellis coding method as in claim 1, wherein said binary trellis code is a linear and time-invariant one, i.e., a binary convolutional code.

5. A multilevel trellis coding method as in claims 1 or 2, wherein the delay constants $\lambda_2,\lambda_3,\ldots,\lambda_m$ are distinct values and/or some but not all of the delay constants $\lambda_2,\lambda_3,\ldots,\lambda_m$ are set to zero.

6. A multilevel trellis coding method as in claims 1 or 2, wherein the delay constants $\lambda_2,\lambda_3,\ldots,\lambda_m$ are all identical.

7. A multilevel trellis coding method as in claims 1 or 2, wherein the signal space is a signal constellation, and said method is used to design trellis coded modulation.

8. A multilevel trellis coding method as in claims 1 or 2, wherein the signal space is a vector space, the components of whose vectors are binary, and said method is used to design binary trellis codes.

9. A multilevel trellis coding method as in claim 1, wherein said single binary trellis code generates h·m bits bits at each time unit (h is an integer), whereby every m bits are independently processed by a multilevel delay processor and a signal mapper so as to generate h signal points at each time unit.

10. A multilevel trellis coding method as in claim 2, wherein said binary trellis codes are linear and time-invariant codes, i.e., binary convolutional codes.

11. A multilevel trellis coding method as in claim 2, wherein said single binary trellis code generates h·m bits at each time unit (h is an integer), whereby every m bits are independently processed by said multilevel delay processor and signal mapper so as to generate h signal points at each time unit.

* * * * *